US008130001B1

(12) United States Patent
Dutta et al.

(10) Patent No.: US 8,130,001 B1
(45) Date of Patent: Mar. 6, 2012

(54) SYSTEM AND METHOD FOR DETECTING A PROTECTIVE DEVICE HAS LIMITED OR INTERRUPTED CURRENT IT CARRIES

(75) Inventors: Prabal Dutta, Berkeley, CA (US); Wei Hong, Berkeley, CA (US); David E Culler, Berkeley, CA (US); Malay Thaker, Palo Alto, CA (US)

(73) Assignee: Cisco Technology, Inc., San Jose, CA (US)

( * ) Notice: Subject to any disclaimer, the term of this patent is extended or adjusted under 35 U.S.C. 154(b) by 821 days.

(21) Appl. No.: 12/154,096

(22) Filed: May 19, 2008

Related U.S. Application Data

(60) Provisional application No. 61/007,026, filed on Dec. 9, 2007.

(51) Int. Cl.
*G01R 31/02* (2006.01)

(52) U.S. Cl. .................................. 324/537; 324/764.01

(58) Field of Classification Search .................. 324/537
See application file for complete search history.

(56) References Cited

U.S. PATENT DOCUMENTS

| | | | | |
|---|---|---|---|---|
| 4,530,024 | A * | 7/1985 | Brady, Jr. | 361/63 |
| 2002/0064010 | A1* | 5/2002 | Nelson et al. | 361/64 |
| 2003/0176959 | A1* | 9/2003 | Breed | 701/36 |
| 2005/0172024 | A1 | 8/2005 | Cheifot et al. | |
| 2006/0054025 | A1 | 3/2006 | Kang et al. | |
| 2008/0100436 | A1* | 5/2008 | Banting et al. | 340/539.22 |

OTHER PUBLICATIONS

Non-final Office Action mailed Jul. 18, 2011 in U.S. Appl. No. 12/154,102, 26 pages.
Final Office Action mailed Dec. 13, 2011 in U.S. Appl. No. 12/154,102, 24 pages.

* cited by examiner

*Primary Examiner* — Thomas Valone
(74) *Attorney, Agent, or Firm* — Fish & Richardson P.C.

(57) ABSTRACT

A system and method monitors indicators including other-than-current indicators of protective devices such as cutouts and reclosers, to determine whether the protective devices are restricting, below their rated capacity, or interrupting, current they carry. The system and method dispatches a technician to such device.

24 Claims, 6 Drawing Sheets

SYSTEM AND METHOD FOR DETECTING A PROTECTIVE DEVICE HAS LIMITED OR INTERRUPTED CURRENT IT CARRIES

RELATED APPLICATION

This application claims the benefit of U.S. provisional patent application Ser. No. 61/007,026, entitled, "Method and Apparatus for Managing Power Distribution Equipment Using Remote Data Collection" filed by Prabal Dutta, Wei Hong, and David Culler on Dec. 9, 2007, having the same assignee as the present application, and is related to U.S. patent application Ser. No. 12/154,102, entitled, "System and Method for Dispatching a Technician to a Protective Device" filed concurrently herewith by Prabal Dutta, Wei Hong, David Culler and Malay Thaker and each is hereby incorporated by reference in its entirety.

FIELD OF THE INVENTION

The present invention is related to power transmission and distribution monitoring and more specifically to monitoring of current interruption in power transmission and distribution equipment.

BACKGROUND OF THE INVENTION

Electric power companies transmit and distribute electricity through a power grid. The analogue of a fuse in power distribution systems are known as "cutouts", while the analogue of a circuit breaker are known as "reclosers". When such devices blow or trip, a portion of the device moves from a first position in which it is capable of carrying its rated current, to a second position (or it falls away entirely), in which it is not capable of carrying its rated current, and the current they are capable of carrying can be interrupted or diminished.

The source of the problem that may cause a cutout or recloser to trip may be transient or longer lasting. For example, a tree branch may fall into power lines, shorting them out. The tree branch may remain in place or fall away.

If the source of the problem is transient, the effect of a recloser tripping may be experienced for a shorter amount of time than that of a cutout, because the recloser will at least attempt to place itself back into a state in which it conducts current at its rated capacity. A recloser may make only a limited number of attempts at reclosing, so as not to wear out the recloser from a non-transient source of power problems.

Because reclosers wear out from reclosing, even if the recloser reestablishes the full current flow, it can be desirable to detect the number of times it has done so, so that it can be replaced in advance of the end of its useful life.

What is needed is a system and method for detecting that a device that can interrupt current when it blows or trips, has blown or tripped, and for dispatching a technician to such device.

SUMMARY OF INVENTION

A system and method electrically senses one or more other-than-current indications of a cutout or recloser, referred to as a "protective device", that fully blow or trip, or partially blow so that the protective device can carry less than its rated current capacity. False positives readings that may have a different cause may be filtered out.

If more than one such sensor is used, the different sensors sense different indications of the break or reduction in current, so that if only some indications are exhibited by the protective device as it trips or blows, at least one of the sensors is more likely to detect it. Additionally, if readings from one of the two or more sensors could get filtered out as a false positive from an external influence, such as noise from a passing truck, the other sensor is selected so that that external influence is less likely to show up as a false positive, making it more likely for the protective device tripping or blowing to be picked up as a true positive by the other sensor. In one embodiment, two sensors sense other-than-current conditions of the protective device, which are human-observable conditions such as noise, vibration, or movement of a portion of the protective device, but may also include detection of an electric field having a certain orientation or a change in orientation of the electric field. Other sensors may sense actual indications of current at the protective device, for example, a current detected by a hall-effect sensor or a magnetic field sensor, and such sensors are not considered to detect other-than-current conditions.

A determination may be made as to whether the indication that current has been reduced below the rated capacity of the protective device or has been interrupted at the protective device is followed by an indication that current is flowing through the protective device by the same sensor or other sensors. If such an indication exists, the event is logged and optionally reported, either as a non-outage event or as a reclosure, if the time between the two such indications is consistent with a reclosure and the protective device has been identified as a recloser. This may be done to eliminate false readings of the protective device tripping, or to record a recloser reclosing so that it may be logged, and a technician dispatched when the number of reclosures reaches a threshold number such as the rated number of reclosures of the recloser. A technician may also be dispatched when the number of recent such recloses exceeds a much lower threshold, indicating the protective device may be attempting multiple recloses after a non-transient condition that is causing power transmission problems.

As noted, reporting of a reclosure is only performed if the protective device is a recloser and the time between the two events is consistent with a reclosure. Such time may have a threshold minimum and maximum that is within the expected range of reclosures. In one embodiment, information about the protective device is provided that includes the make and model of the device to allow the minimum and maximum to be looked up in a table based on such information.

If no such indication that current is flowing follows the indication that current is reduced or has stopped flowing, in one embodiment, the reading from each sensor is compared to a threshold to determine whether the sensor reading is above a threshold.

If the sensor reading is below a threshold (or above a threshold), the reading may be considered to be ambiguous, and so in one embodiment, if the sensor reading is ambiguous, optional reports by upstream (with respect to the current flow) devices and downstream devices that indicate whether current is flowing (e.g. from a conventional hall effect sensor on an upstream wire or other device) may be received and checked. Such reports are checked to determine whether the most nearby upstream reporting device that would be expected to report current flow even if no current was flowing through the protective device having the ambiguous sensor reading is reporting no lack of current flow, but the most nearby downstream device that would be expected to report no current flow when current is not flowing through the protective device is, in fact, reporting no current. If such reports have not been received, the sensor readings may be logged as a non-current interruption event and reported at a later time, or reported as a non-current-interruption event.

If such reports have been received, or the sensor reading was not below (or above) the threshold and was therefore not ambiguous, the interruption or reduction of current is reported, for example, to a server, for example, by reporting the sensor reading that triggered the determination that current was at least reduced, or by reporting some or all sensor readings (and optionally, the indications of the upstream and downstream devices) by broadcasting such information from one sensing device to another along the way to the server.

Devices that report power failures by detecting current flow and are used to check ambiguous readings as described above, receive identifiers of upstream and downstream devices and then monitor for power failures. If the power does not fail, they periodically report such lack of power failures to the upstream and downstream devices. If the power fails, they report such power failures to the upstream and downstream devices.

If a protective device is determined to have limited or interrupted the current it carries, an indicator, such as a lamp, is optionally turned on to make it easier for a technician to identify the exact physical location of the protective device that is no longer conducting or conducting at capacity. The indicator may be turned on via a command received from a technician, allowing the indicator to remain off until the technician is in its vicinity. A locally generated request, such as from a technician in the vicinity of the protective device no longer conducting or conducting at its rated capacity may be received, and in response, a log of the sensor readings recorded as described herein is provided.

At a central device, reports of the sensor readings may be received and processed. Multiple simultaneous reports that may indicate current interruptions at the protective device or of a reduction of current below the rated current capacity of the device may be grouped, such as geographically, to isolate multiple incidents from one another.

If a group has only one report, the central device dispatches a technician to the protective device to which that report corresponds. If there is more than one report in the group, the one with the highest number of other-than-current indications (e.g. those that have a human observable basis other than a lack of current) reported is identified as the one to be investigated by a technician, who is then dispatched by the central device. If there is a tie for the highest number of other than-current indications, some of the reports may be eliminated, for example, based on the layout of the power distribution system, or based on the sensor readings, and a technician is dispatched to the devices corresponding to the reports not eliminated.

DETAILED DESCRIPTION OF A PREFERRED EMBODIMENT

Figure 1:
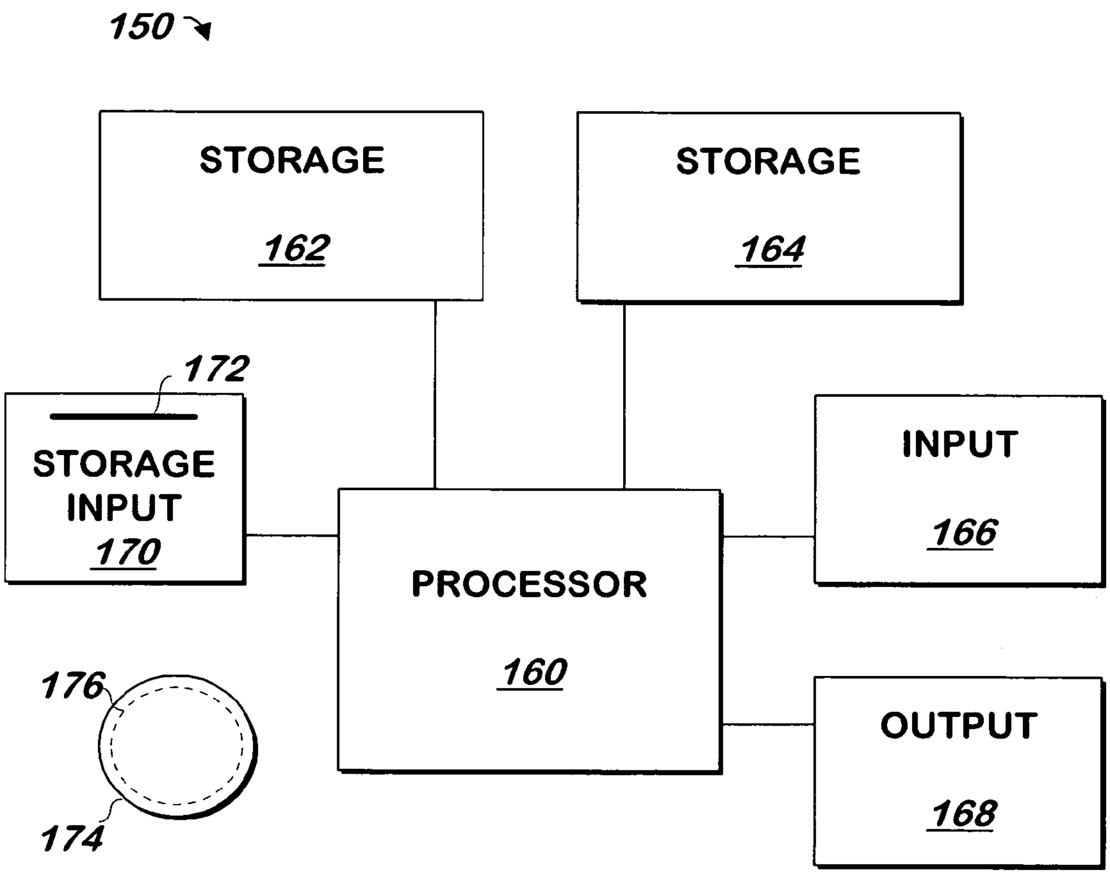
FIG. 1 (PRIOR ART)
FIG. 1 is a block schematic diagram of a conventional computer system.

The present invention may be implemented as computer software on a conventional computer system. Referring now to FIG. 1, a conventional computer system 150 for practicing the present invention is shown. Processor 160 retrieves and executes software instructions stored in storage 162 such as memory, which may be Random Access Memory (RAM) and may control other components to perform the present invention. Storage 162 may be used to store program instructions or data or both. Storage 164, such as a computer disk drive or other nonvolatile storage, may provide storage of data or program instructions. In one embodiment, storage 164 provides longer term storage of instructions and data, with storage 162 providing storage for data or instructions that may only be required for a shorter time than that of storage 164. Input device 166 such as a computer keyboard or mouse or both allows user input to the system 150. Output 168, such as a display or printer, allows the system to provide information such as instructions, data or other information to the user of the system 150. Storage input device 170 such as a conventional floppy disk drive or CD-ROM drive accepts via input 172 computer program products 174 such as a conventional floppy disk or CD-ROM or other nonvolatile storage media that may be used to transport computer instructions or data to the system 150. Computer program product 174 has encoded thereon computer readable program code devices 176, such as magnetic charges in the case of a floppy disk or optical encodings in the case of a CD-ROM which are encoded as program instructions, data or both to configure the computer system 150 to operate as described below.

In one embodiment, each computer system 150 is a conventional SUN MICROSYSTEMS ULTRA 10 workstation running the SOLARIS operating system commercially available from SUN MICROSYSTEMS, Inc. of Mountain View, Calif., a PENTIUM-compatible personal computer system such as are available from DELL COMPUTER CORPORATION of Round Rock, Tex. running a version of the WINDOWS operating system (such as 95, 98, Me, XP, NT or 2000) commercially available from MICROSOFT Corporation of Redmond Wash. or a Macintosh computer system running the MACOS or OPENSTEP operating system commercially available from APPLE COMPUTER CORPORATION of Cupertino, Calif. and the MOZILLA browser commercially available from MOZILLA FOUNDATION of Mountain View, Calif. or INTERNET EXPLORER browser commercially available from MICROSOFT above, although other systems may be used.

Figure 2A:
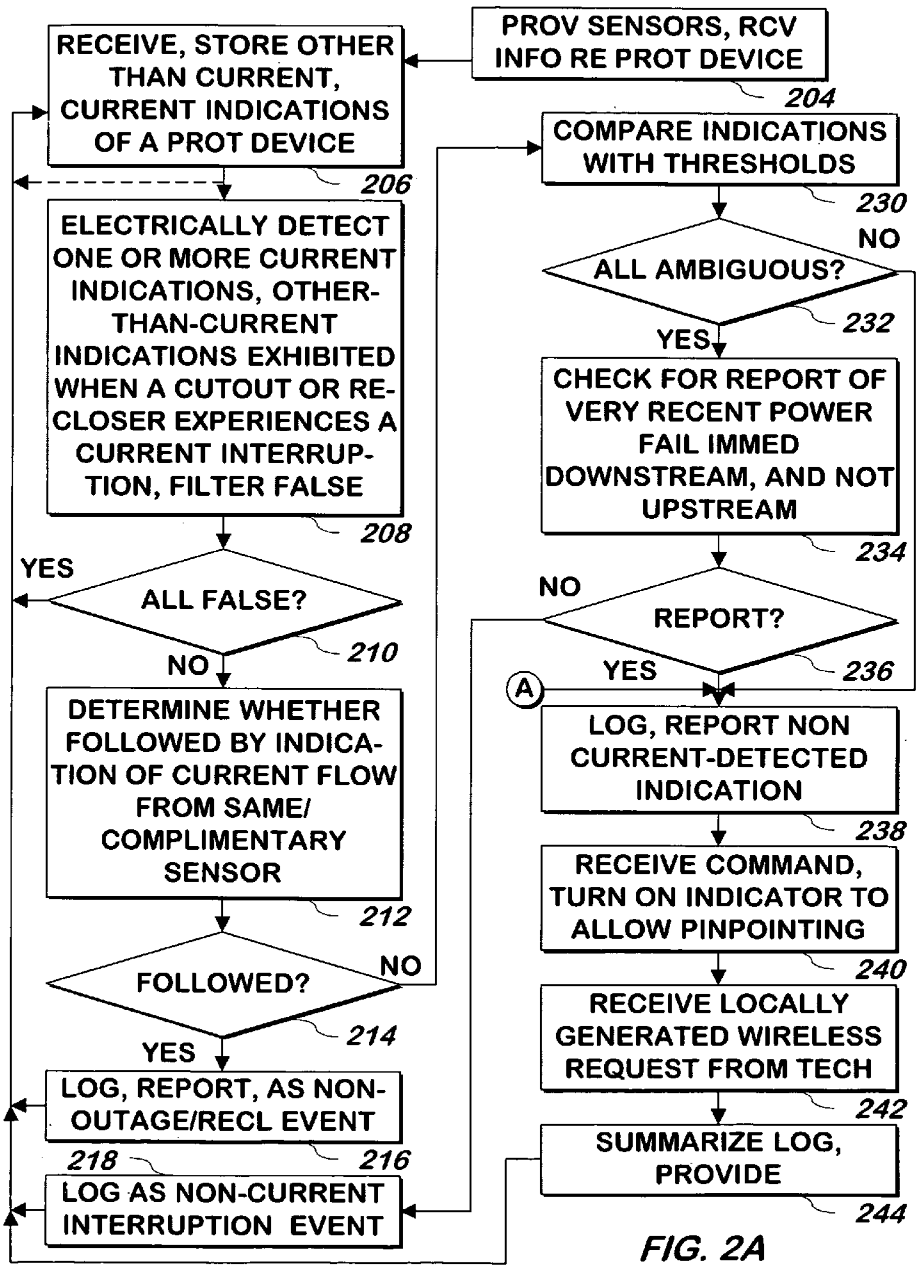
FIG. 2A is a flowchart illustrating a method of monitoring for, detecting, logging and reporting an indication of an interruption or reduction of current or other-than-current-interruption event in a protective device according to one embodiment of the present invention.

FIG. 2A is a flowchart illustrating a method of identifying a reduction, below a rated current carrying value, or loss, of current in a protective device according to one embodiment of the present invention. Referring now to FIG. 2A, one or more indications of a cutout or recloser, referred to herein as a "protective device", are received and stored 206, for example, from one or more sensors.

The indications may be indications of how much or whether current can be measured flowing through the protective device, such as would be received from a conventional current sensor, such as a conventional hall effect sensor or magnetic field sensor, or they may be other-than-current indications of characteristics exhibited by the protective device or experienced by the protective device. In one embodiment, other-than-current indications may be indications that are not solely measures of current flowing through the protective device, but may instead be indications of features observable by a human standing near the protective device without assistance of a mechanical or electric device. In one embodiment, other-than-current indications include indications of a change in position by the fuse tube or other component part of a protective device that can move when the device stops conducting current or conducts current below its rated capacity, such as would be made by an infra-red range finder on the body of the device that is aimed towards the arm to detect movement, an ultra violet imager aimed at the end of the fuse tube that can separate from the cutout when the fuse tube blows to detect arcing that may occur, or by a mercury switch or inclinometer on the fuse tube or other component part, or by a vibration detector or microphone on the protective device. The component part of a protective device may be the fuse tube of a cutout or a switch arm of a recloser. If the protective device has a lamp that lights or provides another display of the device no longer conducting current, such as a red indicator on a switch of a recloser, appropriate visual sensors such as photoelectric sensors or color sensors may be used.

In one embodiment, an electric field sensor senses significant changes in an orientation of an electric field emanating from a normally conducting portion of the protective device (e.g. the fuse tube of a cutout) that will occur when the protective device starts or stops conducting current or limits it significantly less than its rated current-carrying capacity.

When a cutout limits or interrupts current, the fuse tube of a cutout can make a noise, and then change position or fall away from the body of the cutout. A switch arm of a recloser can make a noise, change position and light up or a color indicator may be displayed. Any indication that such a human-observable characteristic or electric field change has occurred may be an indication that is received as described herein.

In one embodiment, the one or more indications are received from one or more sensors. If more than one sensor is used, the different sensors sense different indications of the break or reduction in current, so that if only some indications are exhibited by the protective device, at least one of the sensors is more likely to detect it. Thus, for example, if the fuse tube opens partly, and not loudly enough to overcome the ambient noise, an infra-red range finder aimed towards the fuse tube may detect the change in position, even though a microphone may not pick it up. Significant sudden changes in an electric field in the vicinity of the device may detect the fact that the device is no longer conducting a current at its rated capacity, even in the absence of any other human observable changes on the protective device.

One or more of the sensors providing the indications may sense actual indications of current at the protective device, for example, a current detected by a hall-effect sensor. However, it is possible that the fuse tube will only open slightly, causing it to conduct current, though much less than its rated current carrying capacity. For example, the fuse tube may conduct at less than 50% or 20% or 10% of its rated current carrying capacity. An other-that-current sensor may provide an indication that the cutout is carrying less than its rated capacity, even though reading the current indications from a current sensor of the same cutout would show that no changes were detected.

In one embodiment, indications are a measurement of characteristics experienced or exhibited by a protective device. In one embodiment, the measurements are received in analog or digital form, for example, from a conventional sensor.

In one embodiment, the multiple other-than-current sensors are selected with at least two criteria. The first criteria for the selection of the other-than-current sensors is that that at least one sensor will provide an indication that the protective device has interrupted current, even if the indications from a different sensor could be filtered out as a false positive, when an expected external influence would cause such filtering to occur. For example, if one sensor is a vibration sensor, a passing truck, the external influence in this case, could cause readings from the vibration sensor that is blowing or partly blowing (so that it still conducts current, though below its rated capacity when one end of the fuse tube moves but does not separate from the rest of the cutout) to be filtered out as a false positive. The vibration sensor readings could be eliminated as a false positive due to a duration or overall waveform shape that is inconsistent with the protective device blowing or partly blowing. The indications from a microphone as a sensor would also cause the noise from the protective device blowing or partially blowing to be filtered out as a false positive because of the passing truck, and thus may not represent a suitable additional sensor when used with a vibration detector. However indications an infrared proximity detector may not be filtered out from a passing truck, and so such an additional sensor could represent a proper additional sensor, though all three such sensors could also be used as long as one would not be expected to be filtered out from external influences. In an environment in which passing trucks are not typically experienced, a microphone and vibration sensor could represent two proper sensors.

An expected "external influence" as used herein is an external event or series of events that is likely to be identified as a false positive, and therefore filtered, by the receiver of indications from at least one sensor, and having a chance of occurrence that is more than remote. A lightning strike would be considered remote. A passing truck or airplane could be an expected external influence if the sensor is nearby where such things could influence a sensor at least once per month, though it need not mask an actual event of a protective device blowing or partly blowing anywhere near that often, or even ever.

The second criteria that may be used to select the multiple other-than-current sensors is that at least one of them is very likely to detect any blowing or partial blowing of a protective device. Blowing or partial blowing of a protective device means a protective device that stops conducting current or stops conducting current at its rated current carrying capacity in response to an event, so that the current carrying capacity is substantially (e.g. at least 20%) below its rated current carrying capacity.

Either or both of the above criteria may be used to select multiple other-than-current sensors in one embodiment.

A determination is made as to whether the indications received from a protective device are consistent with the device interrupting current or becoming unable to carry current at its normal capacity, and such determination may include filtering readings that are not solely consistent with the protective device having interrupted, or restricted to less than capacity, current 208.

In one embodiment, step 208 includes filtering the indications to ignore indications that are likely false positives. For example, noise or vibration may be filtered as a false positive if it persists for longer than a threshold amount of time, or has a characteristic that is different from that of a protective device that is interrupting current or is unable to carry its normally rated current because it has partially blown. The characteristic may be a function of the type of protective device, or an environmental type in which the protective device operates (e.g. "busy street"), both of which may be received in step 208.

If all of the readings indicating that the current has been interrupted or limited below the rated capacity of the protective device 210, the method continues at step 206. Otherwise 210, the method continues at step 212.

At step 212, a determination may be made as to whether the one or more indications that current has been limited or is no longer flowing is followed by an indication that current is flowing through the protective device. Such an indication may be provided by the same sensor that provided the indication that no current was flowing or it may be provided by other sensors. If such a condition exists 214, the event is logged and optionally reported 216, either as an other-than-current-interruption event, if the protective device is a cutout, or as a reclosure, if the time between the two such indications is consistent with a reclosure and the protective device has been identified as a recloser. In one embodiment, reporting of these types of events may be reported less quickly than reporting of an outage event as described herein.

Figure 2B:
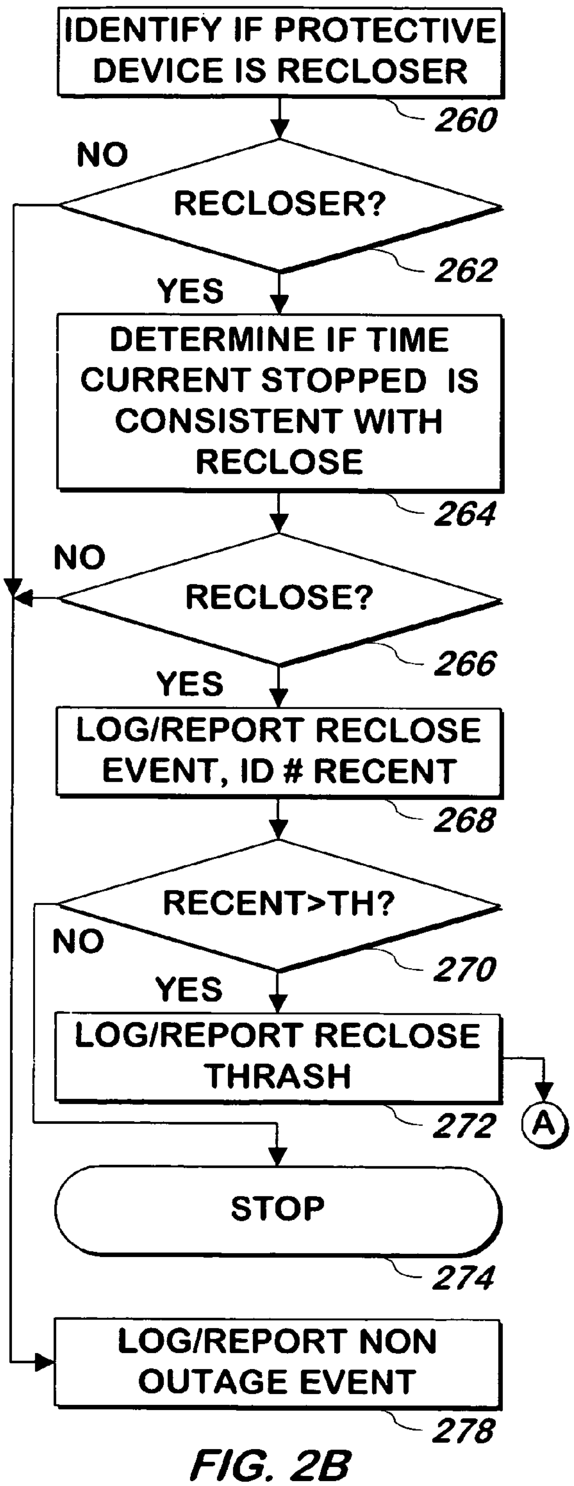
FIG. 2B is a flowchart illustrating a method of reporting or logging a detected reclose or other-than-current-interruption event of FIG. 2A according to one embodiment of the present invention.

Referring momentarily to FIG. 2B, a method of reporting or logging reclose or other-than-current-interruption events is shown according to one embodiment of the present invention. A determination is made as to whether the protective device being monitored is a recloser 260. Such determination may be made based on the information about the device received in step 208 of FIG. 2A. If the device is not a recloser 262, the event is logged and/or reported as an other-than-current-interruption event 278. If the device is a recloser 262, a determination is made 264 as to whether the amount of time that the current was detected as not flowing is consistent with a reclose for the device, for example, it is within the normal range of a reclose for that type of device. If so 266, the event is logged and/or reported as a reclose event 268 and otherwise 266, the event is reported and/or logged as an other-than-current-interruption event 278. Following step 278 and step 274, the method continues at step 210 of FIG. 2A.

In one embodiment, as part of step 268, a determination is made as to the number of recent recloses that have occurred. If the number of recent (e.g. in the last minute or five minutes or a period that differs based on the model number of the recloser) recloses exceeds a threshold 270, a log is made and a report is generated and sent to a server that the recloser is thrashing or otherwise has exceeded the threshold number of recloses in the period as described herein 272, and the method continues at step 238 of FIG. 2A. The threshold may be determined using a table that relates the model number or type of the recloser to the threshold, and the information about the specific protective device that is sensing the reclosure may be used to look up the threshold in the table. In another embodiment, an adaptive technique may be used to ascertain the threshold that is used by the recloser and that threshold is used as the threshold. The adaptive mechanism may, for example identify a maximum number of recent recloses that have occurred during a one minute period in which the number of recloses exceeds a) minimum number, such as 1, or may identify the number of recloses within one standard deviation of an average over the last N minutes. The threshold may be selected based on the number of recloses the device is expected to attempt before stopping.

Referring again to FIG. 2A, if no such indication that current is flowing follows the indication that current is reduced or has stopped flowing 214, in one embodiment, each indication that indicated that current was being limited or interrupted is compared 230 to a threshold to determine whether that indication is ambiguous. In one embodiment, a reading is ambiguous if it is not above a threshold, though other readings may be ambiguous if they are below a threshold. Such a reading may indicate a slight motion of the portion of the protective device being monitored, or it may be from an external event such as a passing airplane, and not from the protective device tripping or blowing.

If no such indication (e.g. a sensor reading) is above a threshold 232, the reading or readings may be considered to be ambiguous, and so in one embodiment, if the indication is ambiguous, optional reports by upstream (with respect to the current flow) devices and downstream devices that indicate whether current is flowing (e.g. from a conventional hall effect sensor on an upstream wire or other device) and may have been received as described herein are checked to determine whether the most nearby upstream (in the direction of the current flow) reporting device that would be expected to report current flow even if no current was flowing through the protective device having the ambiguous sensor reading is reporting no lack of current flow, but the most nearby downstream (in the direction of current flow) device that would be expected to report no current flow when current is not flowing through the protective device is in fact reporting no current 234. If such reports have not been received 236, the sensor readings may be logged and optionally reported as an other-than-current-interruption event 218.

If such reports have been received 236, an interruption or limitation of current is reported 238, for example, to a server, for example, by wirelessly broadcasting the indication that indicated that current was being limited or interrupted or by reporting all indications (and optionally, the indications of the upstream and downstream devices), for example by broadcasting such information from one sensing device to another along the way to the server.

Figure 3:
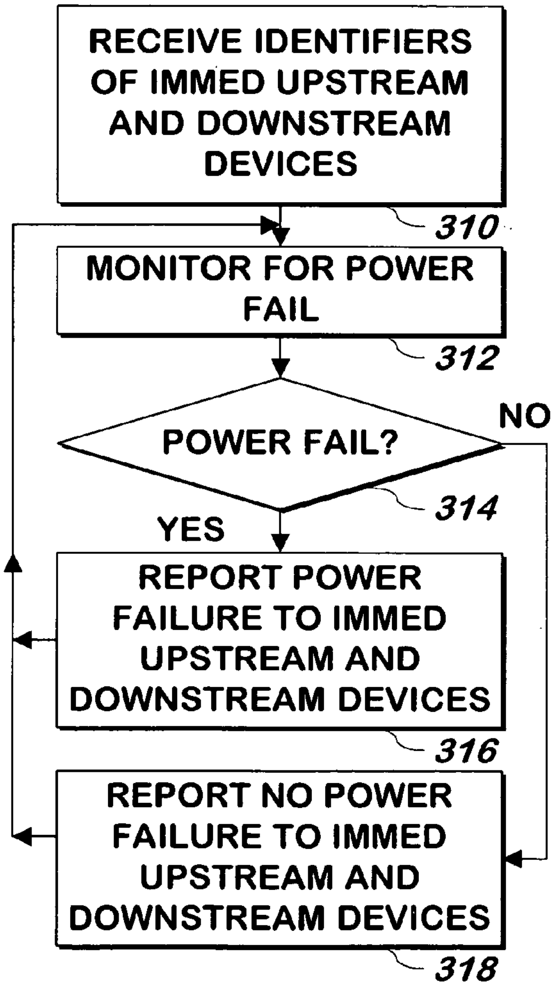
FIG. 3 is a flowchart illustrating a method of reporting power failures to nearby devices according to one embodiment of the present invention.

As described herein, to determine whether an ambiguous indication represents a reduction or interruption in current, reports of power failures are consulted. Referring momentarily to FIG. 3, a method of reporting power failures to nearby devices is shown according to one embodiment of the present invention. Such a method may be used by other devices that report their status for use as described above with reference to step 234 of FIG. 2A. Devices that report power failures by detecting current flow receive 310 identifiers of upstream and downstream devices to whom they should report and then monitor 312 for power failures. Monitoring for power failures may be made for example, by using conventional hall effect sensors on a wire as described in the related application. If the power does not fail 314, a report is made 318 of such lack of power failures to the upstream and downstream devices. If the power fails 314, a report 316 is made of such power failures to the upstream and downstream devices. The reports made in steps 316 and 318 may also be made to a server, optionally, wirelessly, via one or more devices that monitor current and/or protective devices.

Referring again to FIG. 2A, an indicator, such as a lamp, is optionally turned 240 on at or near the protective device to make it easier for a technician to identify the exact physical location of the protective device that is no longer conducting current or conducting current at capacity. The indicator may be any indicator that is observable by a human without any further mechanical or electrical assistance. In one embodiment, the indicator allows an observer standing on the ground to identify which of several protective devices has indicated that the power has failed or that there is another transmission or distribution issue as described herein. In one embodiment, the indicator is turned on in response to a signal from a server, as described below, so that false positive readings can be filtered as described herein. In one embodiment, the indicator automatically turns off after a certain period of time, such as 10 hours.

In one embodiment, a technician can turn the indicator on, for example, using a handheld wireless device that transmits a code to turn on the indicator of the device. In one embodiment, the technician receives the identifier of the monitoring device that detected a power transmission issue as described herein from a server that dispatched the technician, and when the technician is in the vicinity of the monitoring device, the technician or the server enters that identifier into the handheld wireless device and the handheld wireless device transmits a code to the monitoring device, either directly, or via the server, to turn on its indicator and the monitoring device complies if the identifier received matches its own. This allows the indicator to remain off until the technician is in the vicinity of the indicator, thereby conserving battery power. The handheld wireless device may include a cell phone that receives commands via voice, keypad or touch tone and transmits them to the server. The server then wirelessly transmits the command to the monitoring device, optionally via several other wireless devices, including other monitoring devices.

A locally generated request, such as from a technician in the vicinity of the protective device that reported that it is no longer conducting or no longer conducting at capacity may be received, and in response, a log of the indications recorded as described herein is provided. The method continues at step 210.

In one embodiment, any or all of steps 240-244 may be omitted, making any of them optional. Other steps described herein may also be optional.

The monitors of various protective devices in a power transmission and/or distribution system that are geographically dispersed will report sensor information to a server as described above. In one embodiment, the reported information includes any or all of the number of sensors that indicated a non-current or low current condition, the readings from all sensors, an identifier of the monitor, an identifier of the protective device being monitored by the monitor, and an optional indication of the location of the monitor or protective device, such information having been received from a technician when the device was installed, or from a conventional GPS sensor or both. As noted above, reporting to the server may involve wirelessly broadcasting the information from one monitor to another to another until the information reaches the server.

Figure 4A:
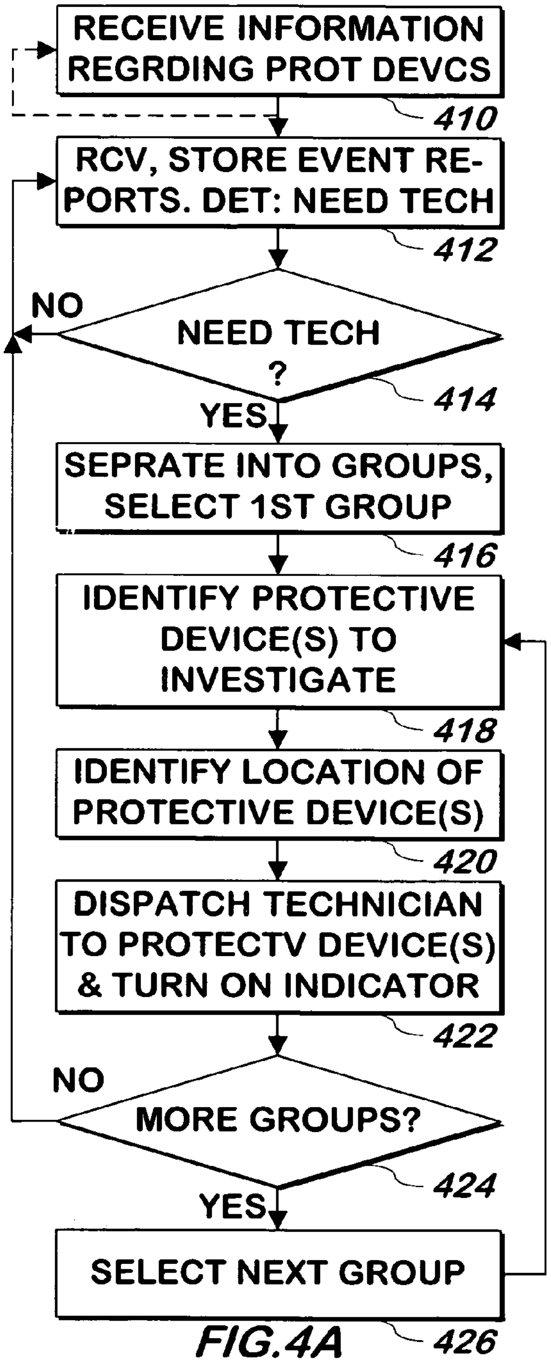
FIG. 4A is a flowchart illustrating a method of responding to reports of FIG. 2A according to one embodiment of the present invention.

Referring now to FIG. 4A, a method of identifying one or more protective devices to investigate as a source of a power issue is shown according to one embodiment of the present invention. The power issue may be a maintenance issue, such as can be due to a recloser approaching, meeting, or exceeding its rated number of recloses, or it may be a more urgent issue, such as when a protective device is restricting, below its rated value, or interrupting current flowing through it, for example because a cutout has blown or partly blown, or a power fault has occurred, for example, due to a tree branch falling on a power line.

Information regarding monitors of protective devices is received 410. The monitors may perform the methods of reporting as described herein. In one embodiment, such information may include whether the monitor monitors a protective device that is a recloser or a cutout, its location, and its relationship relative to current flows of other monitored protective devices in the power distribution and/or transmission system as described herein. Such information may be received from the monitors themselves, or from an administrator. In one embodiment, such information may be discovered using information received from any source, for example by studying a relationship between evidence of physical characteristics of current shutdown or limitation by the protective device and a restart of current flow through the device, both provided by the monitor, with no corresponding technician activity, for example to determine if a protective device is a cutout or a recloser. In one embodiment, step 410 is a repeating or continuously running process as shown by the dashed line in the Figure.

Reports of events as described above, both events that indicate that a protective device has restricted (below its rated capacity) or interrupted current flow and those that may be non-current interruption events, are received and stored 412. Such reports may be those received as described herein. In one embodiment, step 412 may include waiting a sufficient period of time after a report of a current limitation or interruption by an amount of time in which other reports of current limitations or interruptions that are related to the one received will have been received. A determination is made as to whether any of the event reports received require a technician. In one embodiment, an event report indicates a technician is needed if the event report indicates that current has been interrupted or limited by a protective device as part of step 412.

In one embodiment, a technician is considered to be needed in step 412 if the monitor indicates that current has been limited or interrupted in a recloser more than a threshold number of times since the last time a technician was dispatched to that recloser, even if the current is resumed by the recloser. Prior reports of recloses by the same device may be used to determine if the threshold has been reached. A table that relates the monitor to the threshold may be used to make such determination in one embodiment.

If no such indication is present from those recently received reports 414, the method continues at step 412.

If such an indication is present 414, any instances of multiple reports are separated into groups of related or potentially related reports and the first group is selected 416. Thus, if multiple monitors will report power outages that can occur from a single source, reports of power outages that are likely to have occurred from the same source may be grouped. For example, if a current sensor will detect the lack of power, it is possible that a monitor will report this as an indication that power has been interrupted, in spite of the fact that the protective device which the monitor is monitoring will not have provided any other indication that the protective device is actually the source of the current interruption.

In one embodiment, reports are grouped with one another if the devices corresponding to the reports are "contiguous" to one another, meaning there is not one or more protective devices that may be the subject of a report between them in the flow of current that have not reported that current is limited or interrupted. In one embodiment, several reports of such contiguous devices may be grouped only if they were generated or received near to one another in time, for example, those received or generated within a minute or a few minutes of one another. Thus, step 416 may include waiting for any other such reports before grouping them, to allow other near in time reports to be received.

Zero or more protective devices are identified 418 in the selected group as the protective device to have a technician investigate as described in more detail below. As described below, in one embodiment, a non-current interruption event need not have a technician investigate, unless a recloser requires maintenance as described herein, and so there may be zero protective devices that warrant investigation. The location of such devices are identified 420, for example, using the information about the protective devices received in step 410 as described above or information, such as a GPS location, received with each report.

One or more technicians are dispatched 422 to the protective devices to perform suitable corrective measures, such as repair or replacement of the protective device. In one embodiment, step 422 includes sending a signal to any device monitoring a protective device identified in step 418 to turn on an indicator such as a lamp or speaker as described herein, and the monitoring device complies with that request, to allow the technician to quickly locate the protective device identified.

Figure 4B:
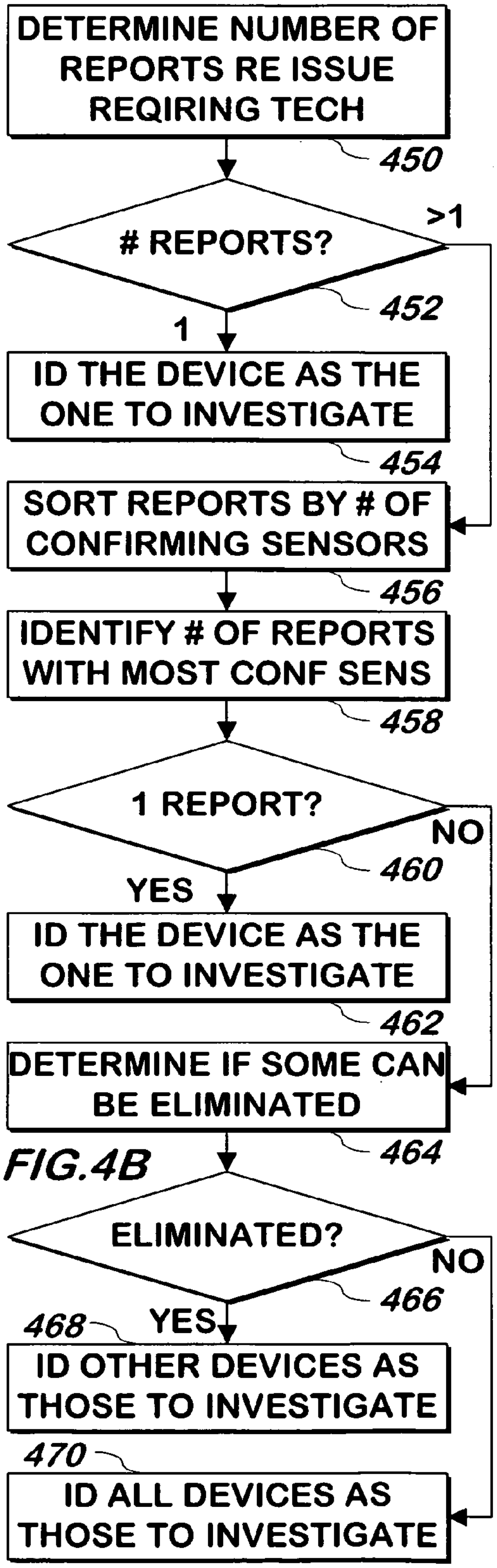
FIG. 4B is a flowchart illustrating a method of identifying one or more protective devices to investigate as a source of a power issue according to one embodiment of the present invention.

Referring now to FIG. 4B, a method of identifying one or more protective devices to identify from a group of one or more reports regarding those protective devices is shown according to one embodiment of the present invention. The group of one or more reports may be those as described herein.

The number of reports in the group that are communicating any issues requiring a technician are identified 450. If there is only one such report in the group, or a number of reports involving only one device in the group (e.g. a protective device that is a recloser approaching or passing the end of its estimated useful life, defined in terms of the number of recloses) 452, that device corresponding to that report is identified 454 as the one to investigate.

Otherwise 452, the reports are sorted 456 by the number of other-than-current-flow sensors of the same protective device that indicate that current is restricted, or interrupted, by the protective device. As used herein, "other-than-current-flow" sensors are those sensors that do not directly determine whether current is flowing, such as hall effect or magnetic sensors, but instead are those that sense human-observable conditions such as vibration, sound, light, color, position, movement or other items that could be observed by a normal, healthy human having all of their senses without the aid of a machine or electric device, or, in one embodiment, sense a specific orientation of an electric field or a change in orientation of an electric field. These other sensors are referred to herein as "confirming sensors". For example, if one device reports that the fuse tube of a cutout has moved and a noise or vibration was detected, and that current is not flowing, that device will be sorted higher than one that just detects that current is not flowing but has no confirming sensors that indicate that current is not flowing or has been restricted below the rated capacity of the protective device. Other-than-current sensors sense other-than-current conditions, and confirming sensors sense confirming conditions. These two terms are intended to be defined as described herein.

The number of reports in the group with the highest number of confirming sensors indicating that current is being restricted, or interrupted, by the protective device is identified 458. If there is one such report 460, the corresponding device is identified 462 as the one to investigate.

Otherwise 460, a determination is made 464 as to whether some of the reports in the group having the most number of confirming sensors can be eliminated from consideration as those corresponding to protective devices to investigate. In one embodiment, such protective devices can be eliminated if they are downstream from the source of current of another device that is so reporting.

In one embodiment, a report may be eliminated if a sensor reading is such that, when considered with a sensor reading from another monitor, may indicate that the first sensor reading is not sufficient to indicate the protective device corresponding to the sensor is the source of the current limitation or interruption. For example, a noise or vibration sensor may be triggered by a nearby protective device that fails, not the protective device corresponding to the report. In such case, the reading from the vibration or noise sensor reading in the report corresponding to the protective device nearby the protective device that limited or interrupted the current may be lower than the vibration or noise sensor of the protective device that limited or interrupted the current. The lower reading may be, by itself, reason enough to investigate the protective device monitored by that sensor, but in conjunction with a higher noise or vibration sensor reading from a nearby device received around the same time, may allow the report with the lower sensor reading to be eliminated.

If some of the reports may be eliminated 466, the protective devices corresponding to the remaining reports are identified 468 as those that should be investigated. Otherwise 466, all such protective devices corresponding to the reports with the highest number of confirming sensors indicating that current is being limited in, or interrupted by, the protective device are identified as those that should be investigated 470.

System

Figure 5:
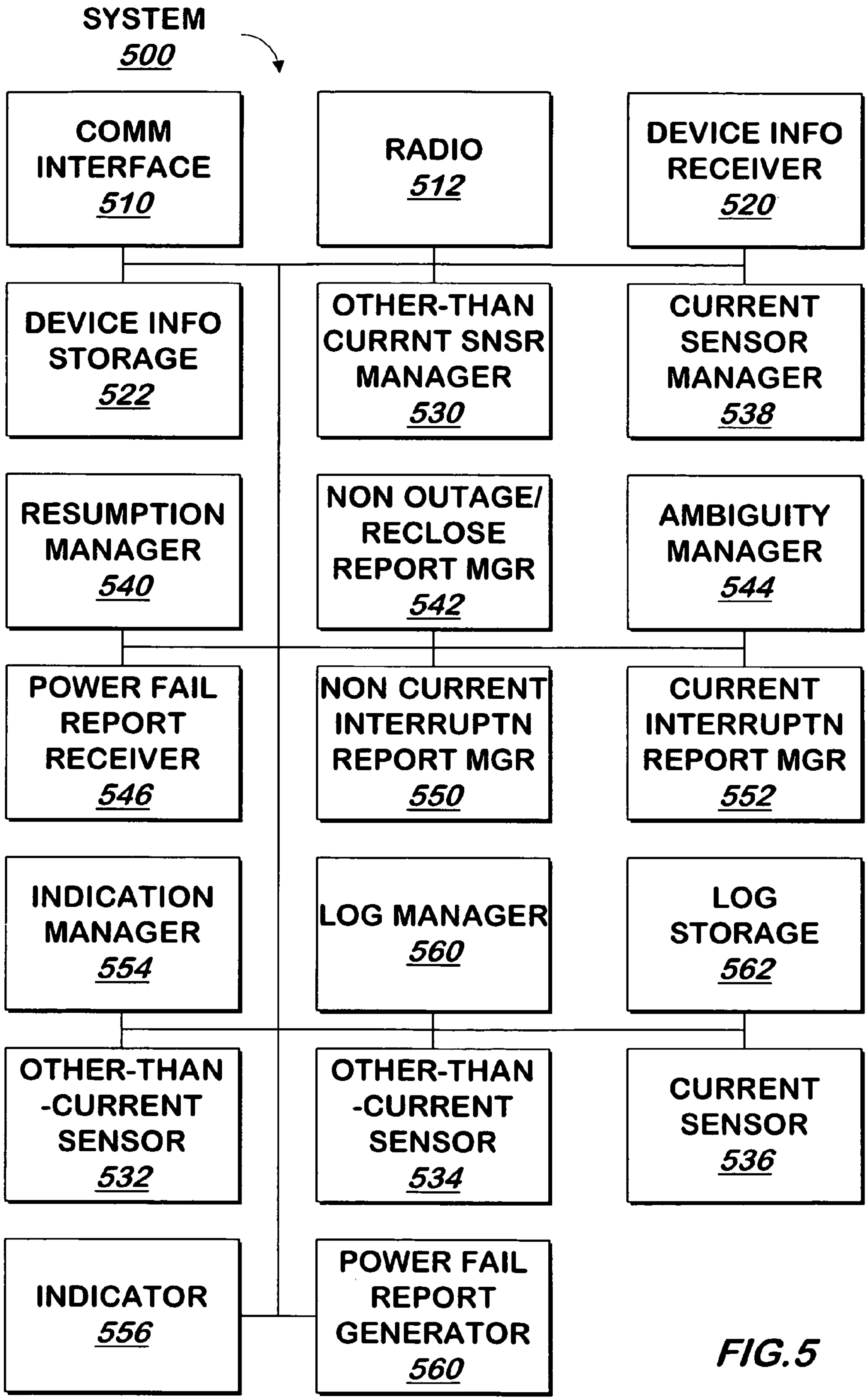
FIG. 5 is a block schematic diagram of a system for monitoring one or more protective devices according to one embodiment of the present invention.

Referring now to FIG. 5, a system 500 for monitoring for power issues on a protective device is shown according to one embodiment of the present invention. In one embodiment, some or all of the components 510-536 of system 500 will be mounted on or near a protective device. In one embodiment, some components 510-536 may be shared by multiple protective devices, while other components 510-536 may be dedicated to a particular protective device being monitored by system 500.

Communication interface 510 includes a conventional communication interface running wireless communications software allowing for message transmission and reception via radio 512, which is a conventional radio including a conventional antenna. In one embodiment, all communication into and out of system 500 is made via communication interface 510 and radio 512. Although wireless communication is used in the embodiment shown, wired communications may be used via communication interface 510.

Device information receiver 520 receives the information about the protective device as described above and stores it in device information storage 522. Information about a variety of devices (such as a table of thresholds) may also be received via device information receiver 520 and stored in device information storage 522, or device information receiver 520 may request, receive such information from a server (not shown) and store it in device information storage 522 when protective device information such as make and model number is received regarding the protective device or devices that system 500 will monitor.

Other-than-current sensor manager 530 receives indications of other-than-current conditions of the one or more protective devices being monitored by system 500 from other-than-current sensors 532, 534, which include conventional sensors that sense different types of indications of the one or more protective devices being monitored as described above. One type of indication may be visual, and another type audible, while another type is vibration, and still another type is the strengths of a certain orientation of an electric field. Other-than-current sensors 532, 534 are placed on or near the protective device to allow them to monitor the protective device.

Sensors that may be used may include the conventional Measurement Specialties, Inc. 0-1002794-0 vibration sensor commercially available as part MSP1007-ND of digikey-.com; the conventional Honeywell HMC1053 magnetic field sensor commercially available as part 342-1035-5-ND of digikey.com; and the conventional Freescale Semiconductor MC33794EKR2 electric field sensor commercially available as part MC33794EKR2TR-ND if digikey.com.

In one embodiment, there is more than one other-than-current sensor monitoring a protective device at the same time to ensure that when the protective device interrupts or limits current significantly below its rated capacity, for example, in response to a short on a power transmission or distribution line, that such event will be detected, even if it is not exhibited by the protective device in a manner that one of the othei-than-current sensors 532, 534 can detect, or even if external interference (such as a passing truck or plane drowning out the noise from a blown cutout) makes it difficult to detect the manifestation of the event in the protective device.

Optional current sensor manager 538 receives indications of current from current sensor 536. All sensors 532-536 may be wired or wirelessly connected to the rest of device 500, and there may be any number of such sensors 532-536 monitoring one or more protective devices, not just the number shown. A group of reclosers may be monitored by a single microphone, but more than one visual sensor, with one visual sensor per recloser. The remainder of system 500 may monitor all of the group of reclosers.

In one embodiment, at least one other-than-current sensor 532, 534 is used in addition to a current sensor 536, to allow for detection of an event in which current is limited below a protective device's highest rated current carrying capacity, but not interrupted, such as may occur from a partially blown cutout in which one end of the fuse tube moves in response to an event that may have caused other cutouts to interrupt current, but does not fully separate from its normal contact point at the cutout. In such circumstance, current will still flow, but the protective device may not be capable of carrying at least 20% or more of the current it is rated to carry when the fuse tube is fully seated. Other-than-current sensors 532, 534 can thus be employed to detect the noise or vibration from the fuse tube moving or the change in position of the fuse tube so as to detect such a condition, even though current will continue to flow, and such current may, in fact, be sufficient for the current needs of the circuit the protective device is protecting, making its detection through any other means that use one or more current sensors alone difficult or impossible.

In one embodiment, periodically, such as once every 5 seconds, the sensor managers 530, 538 store the average reading of each sensor 532-536 they monitor over that period, along with the identifier of the sensor type and the date and time into a sensor log in log storage 562. If multiple protective devices are monitored by a single system 500, an identifier of the device to which the sensor corresponds is also stored in the sensor log in log storage 562, the mapping of sensors (or the ports to which they are connected) to protective devices having been stored by device information receiver 520 into device information storage 522 when received by an installation technician. The sensor managers 530, 538 use such information to store the identifier of the protective device.

In one embodiment, one or both sensor managers 530, 538 filters out potentially false positive readings, logging them as described herein, but not using them to detect an interruption of current or reduction in current carrying capacity of the protective device.

If either other-than-current sensor manager 530 or sensor manager 538 receives an indication indicating a power transmission or distribution issue (e.g. the current flowing through them has been interrupted or the current carrying capacity of the protective device is significantly under its rated capacity) with the protective device or devices being monitored, each sensor manager 530, 538 informs the other.

The sensor manager 530, 538 initially receiving such indication optionally checks device information storage to determine if the protective device or devices corresponding to the sensor is a recloser. Such information is stored in device information storage 522 by device information receiver 520, for example, by an installation technician with a wireless handheld device (not shown). If so, the one or both sensor managers 530, 538 receiving such indication signals resumption manager 540, optionally with identifiers of the sensor or sensors that provided the indication of the power issue. In another embodiment, no such check is made and such sensor manager 530, 538 signals resumption manager as described above.

When so signaled, resumption manager 540 monitors all of, or the same sensors as those with the identifiers it received to determine whether the power issue (which is typically indicating that the device is not able to conduct current at its rated capacity) is being addressed by a recloser reclosing. Resumption manager 540 will monitor the sensors having the identifier it received and/or will monitor current sensor 536 for a period of time after the initial report. Such period may be stored in device information storage 522 as described above tailored to the device corresponding to the server (for example, a maximum reclose time), in which case that period is used.

If resumption manager 540 determines that a recloser at least tried to reclose, resumption manager 540 also retrieves from a system clock (not shown) and internally stores the time of the reclose or attempted reclose in a buffer sized to store a threshold number of recloses, such threshold being optionally stored in device information storage 522 based on the make and model of the recloser or reclosers being monitored. If resumption manager 540 determines that a recloser at least tried to reclose, resumption manager 540 also signals the one or both sensor managers 530, 538 that signaled it and indicates whether a reclose was attempted.

Reclose Attempted

If an indication is received from resumption manager 540 that a reclose was attempted, the sensor manager 530, 538 that initially determined that a power issue had arisen as described above signals non outage/reclose report manager 542, optionally with the identifier of the sensors that caused it to determine that a power issue had arisen. When signaled, non outage/reclose report manager 542 builds a report containing recent readings from the sensor log in log storage 562 for all sensors corresponding to the same device (the necessary information about sensors and devices having been provided to device information receiver 520 and stored in device information storage 522 by a technician who installed the system 500). Several recent readings from each such sensor may be provided as part of the report as well as the dates and times of those readings. The report indicates that a reclose has been attempted and includes the date and time. In one embodiment, the sensor manager 530, 538 that signals non outage/reclose report manager 542 retains the date and time of the power issue that caused it to signal non outage/reclose report manager 542 and such signal includes the date and time. Such date and time is sent as part of the report, along with the current date and time retrieved from a system clock (not shown), an identifier of the system that was stored in device information storage 522 by device information receiver 520, having been received from a system administrator. The report will include sensor readings that span a period from the current date and time to a short time (e.g. 10 seconds) prior to the date and time received by non outage/reclose report manager 542. Non outage/reclose report manager 542 stores the report in log storage 562 and optionally provides it to communication interface 510 as a low priority report.

Communication interface 510 may queue such low priority reports and send them to a server when a certain amount of data (e.g. 10 KB) has been queued or a certain number of reports (e.g. 20) have been received, or during periods of low activity or during periods of historically low activity. At that point, communication interface 510 sends the report or reports to a server, described below, via radio 512. Such reports may be received and forwarded by other similar or identical systems along the way to the server.

In the embodiment in which each system 500 may monitor several protective devices, sufficient information may be stored in device information storage by device information receiver 520 that would enable a technician to identify the protective device that has interrupted current or is not carrying current to its rated capacity. This may be done by sending identifiers of the sensor with the report, and allowing the technician to query the information in device information storage 522 to map the sensor that detected such current issue with the protective device the sensor was monitoring. Alternatively, such information may be retrieved by non outage/reclose report manager 542 and provided with the report. The information may include a protective device identifier that is painted or stamped on the protective device monitored by the sensor that indicated a current issue described herein had occurred.

Reclose Not Attempted

If an indication is received from resumption manager 540 that a reclose was not attempted, or the device was not determined to be a recloser, the sensor manager 530, 538 that initially detected the power issue as described above provides to ambiguity manager 544 the one or more sensor readings that caused it to detect the power issue.

When it receives the sensor readings, ambiguity manager 544 determines if the readings are ambiguous as described above. In one embodiment, the ambiguity thresholds to determine ambiguity are stored in device information storage 522 by device information receiver 520, having been received from a system administrator or from a server as described above.

In one embodiment, the ambiguity thresholds for each sensor may be a function of the type, make and model of sensor, and the type, make and model of the protective device. In one embodiment, such information about the type, make and model is received and stored in device information storage 522 by device information receiver 520 from a technician, and then device information receiver provides it to a server and receives the thresholds in response.

Ambiguity manager 544 determines if the sensor readings are ambiguous by determining if the sensor readings are less than these ambiguity thresholds. If fewer than all of the sensor readings are ambiguous, ambiguity manager 544 indicates that the sensor readings are not ambiguous to the sensor manager 530, 538 from which it received the sensor readings.

Readings Not Ambiguous

When it receives such indication that the sensor readings are not ambiguous, the sensor manager 530, 538 that initially detected the power issue as described above signals current interruption report manager 552 in the same manner as non outage/reclose report manager 542 is signaled. When signaled, current interruption report manager 552 builds a report in the same manner as non outage/reclose report manager 542, but notes in the report that an outage has occurred. In all cases, these reports from either type of report manager 550, 552 include one or more other-than-current sensor readings, and may include current sensor readings as well as the dates and times of such readings. Current interruption report manager 552 provides such report to log storage 562 and as a high priority report to communication interface 510 for rapid transmission to a server via radio 512. As noted, all communications between system 500 and a server may pass through other wireless systems, including devices similar or identical to system 500.

Readings Are Ambiguous

If ambiguity manager 544 determines that all of the sensor readings are ambiguous, ambiguity manager 544 checks log storage 562 for indications that an upstream device is detecting current, but a downstream device is not, as described above. Such indications are received by power fail report receiver 546 and stored with the date and time of receipt into log storage 562 from other systems that are physically remote from system 500 as described herein. Identifiers of upstream and downstream devices are provided by a technician to device information receiver 520 and are stored in device information storage 522 to either allow the indications only to be sent to, or only received by, such devices. In one embodiment, when an indication is received, it is received with the identifier of the device that originated it, allowing power fail report receiver 546 to make the determinations described herein.

If the most recent indications indicate that the upstream device is detecting a flow of current, but the downstream device is not, ambiguity manager 544 indicates to the sensor manager 530, 538 from which it received the readings that the sensor readings are not ambiguous, which proceed as described above. Otherwise, ambiguity manager 544 indicates to the sensor manager 530, 538 from which it received the sensor readings that the readings are ambiguous. When such an indication is received, such sensor manager 530, 538 so indicates to non current interruption report manager 550, which builds a report and provides it to log storage 562 and to communication interface 510 as described above, but indicates in the report that the sensor readings were ambiguous.

Indicator

As described above, indicator 556 may be turned on at such time as a power issue is determined not to be ambiguous and not part of an attempted reclose, though in one embodiment, the indicator may be turned on without both or even either of these, conditions. In one embodiment, when current interruption report manager 552 sends the current interruption report, current interruption report manager 552 signals indication manager 554, which turns on indicator 556. Indicator 556 may include a lamp, such as an LED, or a speaker, to allow a technician to pinpoint the system or protective device corresponding to a power issue being reported. Indication manager 554 may turn off indicator 556 automatically, upon receipt of a signal from power fail report receiver 546 when it receives an indication that a downstream device is sensing current being conducted through it.

In one embodiment, the indicator may be turned on or off by a technician using a handheld wireless device in communication to radio 510. The device may receive from a server the identifier of the device (when the server receives a report of a power failure), and the technician uses the device to broadcast a command to turn the indicator on or off, along with the identifier of the device.

Log Reports

The technician may also use the wireless handheld device to communicate with radio 512 to request the log of sensor readings. The technician supplies the range of time of the log to receive, provides the identifier of the device, and requests the log over that time. Communication interface 510 provides such a request received via radio 512 to log manager 560, which retrieves the information from the log of sensor readings in log storage 562 that correspond to the range received with the request and provides it via radio 512 to the handheld wireless device.

Power Failure Reports

As noted, power fail reports from other devices may be periodically received to allow for ambiguities to be resolved. In one embodiment, power fail reports are based on a current sensor, may be based on a magnetic field sensor, and may not be based on other sensors, for example a microphone, or a visual sensor, because the purpose is to detect power failures that may have a source that is other than a protective device being monitored by system 500, and such other sensors would detect power failures sourced by that protective device.

In one embodiment, if sensor manager 530 or 538 detects such a power failure, such sensor manager 530, 538 signals power fail report generator 560 with an indication that the power has failed. When power is detected as having been resumed, sensor manager 530 or 538 signals power fail report generator 560 with an indication that the power has resumed.

Power fail report manager 560 periodically broadcasts an identifier of system 500, the date and time received from a system clock (not shown) and an indication of whether or not power has failed based on the indications it receives as described above. In one embodiment, only one indication of a power fail or resumption is used by sensor manager 530 or 538 or by power fail report manager 560 to determine that the power has failed or resumed, and in another embodiment, two or more such indications will trigger such a determination. In one embodiment, the number of power resumption indications must be at least as great as the number of power fail indications it most recently received before either sensor manager 530 or 538 or power fail report manager 560 will make a determination that the power has resumed.

Server

As noted, a server receives reports from multiple systems 500, as described in more detail below. The server processes the messages and dispatches a technician to the system most likely to be the most upstream (in the direction of current flow, with upstream meaning nearest the source of current being interrupted) device interrupting power or conducting it significantly under its rated capacity (e.g. less than 70%), as described in more detail herein.

Figure 6:
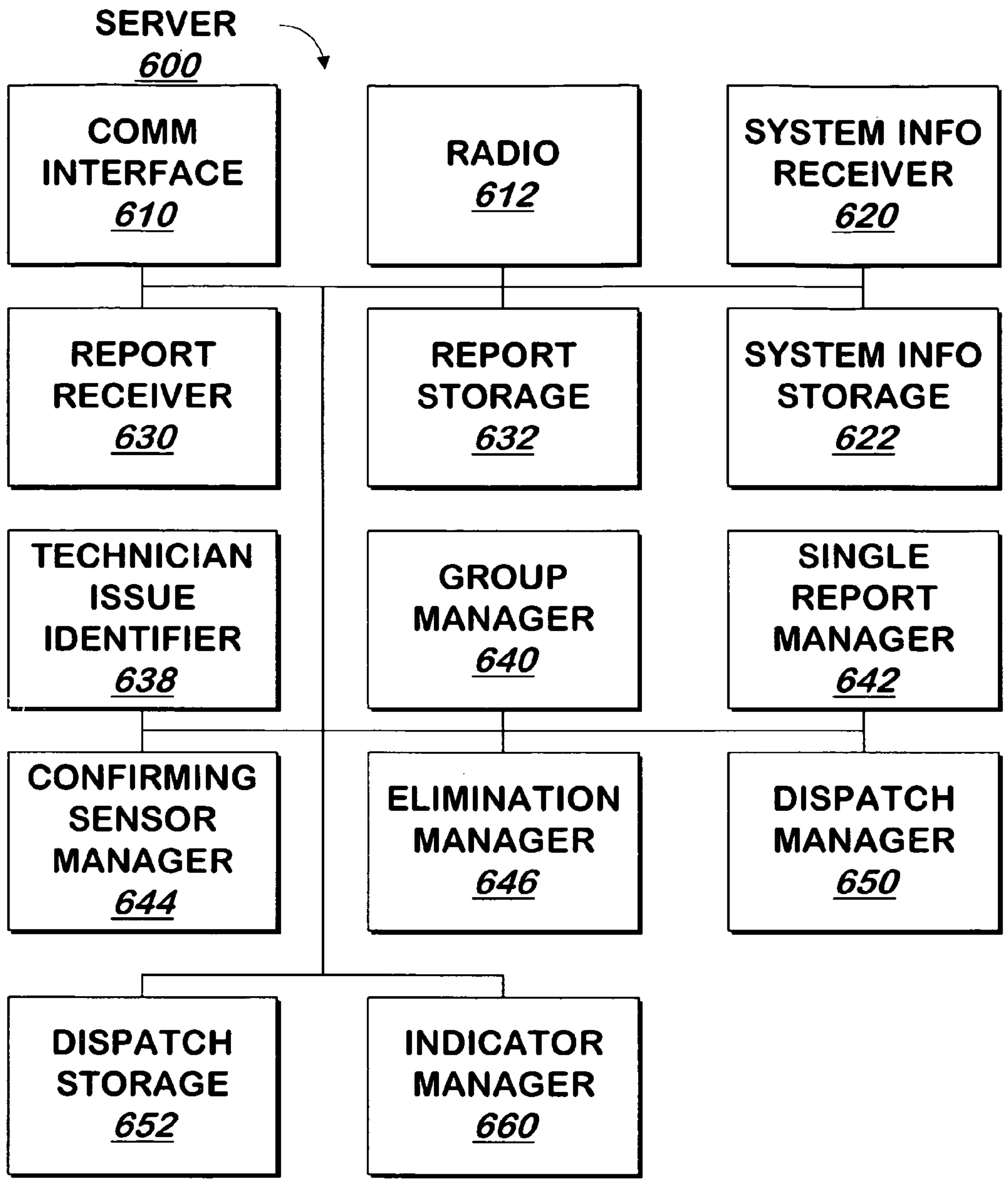
FIG. 6 is a block schematic diagram of a system for responding to event reports from multiple devices similar or identical to the monitor of FIG. 5 according to one embodiment of the present invention.

Referring now to FIG. 6, a server is shown according to one embodiment of the present invention. Communication interface 610 and radio 612 are similar or identical to communication interface 510 and radio 512 as described above with reference to FIG. 5. All communication into and out of server 600 flows through communication interface 610 and radio 612.

System information receiver 620 receives information about systems from which reports may be received as described above and herein. Information may be received about the location and/or type of each protective device monitored and reported by various systems similar or identical to system 500 above. In one embodiment, location information is not so received, but is received with each report described above and herein, such information being stored with the device information in the same manner as the other device information or being provided from a conventional GPS subsystem, and such information is retrieved by the builder of the report, and included in the report. System information receiver 620 stores such system information into system information storage 622. System information storage 622 may include conventional memory or disk storage, and may include a conventional database.

Receipt of Reports

Report receiver 630 receives reports from systems such as system 500 described herein. There may be one such system monitoring every protective device in a power transmission or distribution network. Report receiver 630 stores such reports into report storage 632. Report storage 632 may include conventional memory or disk storage, and may include a conventional database. If the reports do not have a timestamp indicating the date and time of their creation, report receiver 630 adds the timestamp into report storage 632 associated with the report received.

Technician issue identifier 638 periodically checks the reports in report storage 632 to determine the existence of an issue that should be addressed by a technician that was received since the last time technician issue identifier 638 checked for such reports. In one embodiment, an issue that should be addressed by a technician includes one or more reports of a current interruption or a device that is carrying less than its rated current, or a protective device that is a recloser that has a number of recloses that is approaching a rated number of recloses for the protective device, based on all of the reports for that protective device.

Recloser Maintenance or Repair

If technician issue identifier 638 identifies such an issue, if the issue is a recloser that is to be replaced because it is approaching its useful life, technician issue identifier 638 provides an identifier of the recloser, its location, either from the report or by looking the location up in system information storage 622, and an indication that the issue to be addressed is a recloser replacement or repair to dispatch manager 650, which stores such information into dispatch storage 652.

Dispatch manager 650 internally maintains a list of technicians and their locations, and optionally, the model numbers of equipment on which the technicians have been trained or is otherwise equipped to repair or replace. Dispatch manager 650 optionally looks up in system information storage 622 the model number of the protective device corresponding to the device identifier it receives, and then selects a technician nearby, optionally who is equipped or trained to repair or replace that model of device, and provides the device identifier and location to e device which the technician can see or hear as well as an indication that the protective device is a recloser that needs maintenance or replacement due to the number of recloses.

When other elements, described below, provide an identifier of a report to dispatch manager 650, they will not indicate that the issue is a recloser requiring maintenance or replacement, and dispatch manager 650 will indicate to the technician dispatched that the issue is an interruption or limitation of current.

Current Interruption or Limitation: Marking the Reports

If technician issue identifier 638 identifies that the report corresponds to an indication of a current interruption or current being limited well below the rated capacity of a protective device, technician issue identifier 638 marks the report in report storage 632, and optionally sets a timer for two minutes or a little more time than an amount of time in which all reports of a current interruption or limitation that have the same source would be expected to be received. In one embodiment, until the timer goes off, technician issue identifier 638 will continue to mark reports as described above. When the timer goes off, technician issue identifier 638 signals group manager 640. The timer is used to allow additional reports having the same source to be collected. In another embodiment, no timer is used, and technician issue identifier 638 signals group manager 640 upon receipt of the first such report.

Grouping the Reports

When signaled, group manager 640 groups the marked reports as described above, assigning a unique identifier to each group and storing the identifier of the group with the report in report storage 632. Group manager 640 then signals single report manager 642. For any group, group manager 640 continues monitoring report storage and adding any additional members to the group until the same period as the timer has elapsed following the earliest member of the latest group it identifies. When the same amount of time as the timer period elapses from the time the first report in the group was received, group manager 640 marks the group as "closed" in report storage 632.

Single Member Groups

Single report manager 642 identifies all groups marked as closed that have only one member, and provides an identifier of the report to dispatch manager 650, which dispatches a technician to the protective device corresponding to the report as described above and herein. Single report manager 642 marks the report for that group as addressed. If there are additional groups marked as closed but not marked as addressed, single report manager 642 signals confirming sensor manager 644.

Attempting to Use Confirming Sensors to Narrow Down the Reports in Each Group

When signaled, confirming sensor manager 644 sorts the reports in each group that are marked as closed but not marked as addressed by the number of confirming sensors as described above, and marks in report storage 632 the reports with the highest number of confirming sensors in each group as most likely candidates.

Confirming sensor manager 644 provides to dispatch manager 650 an identifier of the report marked as a most likely candidate from any group with no more than one report marked as a most likely candidate, and marks the reports in the group as addressed. Dispatch manager 650 dispatches a technician to the protective device or devices corresponding to the report as described above.

If there are groups that are closed, but not addressed, confirming sensor manager 644 signals elimination manager 646.

Eliminate any Most Likely Candidates

When signaled, elimination manager 646 eliminates any of the most likely candidates as described above, and then sends identifiers of the non-eliminated most likely candidates to dispatch manager 650, then marks the group as addressed. Dispatch manager 650 dispatches one or more technicians to such protective device or devices corresponding to the report, as described above.

Reports

In one embodiment, dispatch manager 650 stores in dispatch storage 652 an identifier of the report and an identifier of the technician dispatched. The technician may report to dispatch manager via one or more systems 500 that the issue has been addressed, and communication interface 510 in each such system 500 will forward the report to the server, optionally using other such systems with which that system is in communication. Such reports are received by dispatch manager 650 and the date and time of the report is added to such report either by the device used by the technician to make such report, or by dispatch manager 650 using a date and time retrieved from a system clock (not shown) when the report is received. Dispatch manager 650 may provide reports of technician activity upon request, for example, by a supervisor.

Indicators

In one embodiment, when a technician is dispatched, dispatch manager 650 provides an identifier of the report to indication manager 660, which provides a command to the system 500 corresponding to the report to turn on an indicator corresponding to the protective device, and the system 500 complies as described above. When the technician reports that the issue for which the technician was dispatched has been addressed, dispatch manager 650 provides an identifier of the report to indication manager 660, which provides a command to the system 500 corresponding to the report to turn off the indicator corresponding to the protective device, and the indication manager 554 in the system 500 complies as described above.

Network

Figure 7:
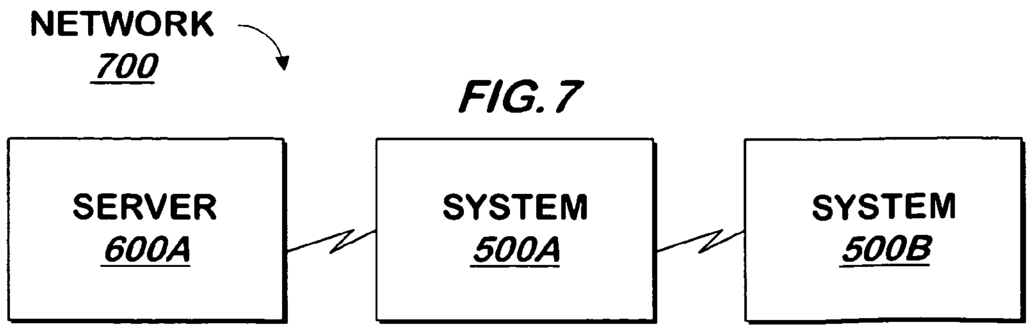
FIG. 7 is a block schematic diagram of two monitoring systems and a server according to one embodiment of the present invention.

FIG. 7 is a schematic diagram of a network of two systems 500A, 500B, each similar or identical to system 500 of FIG. 5, and a server 600A, similar or identical to server 600 of FIG. 6. System 500A is in communication with both server 600A and system 500B. Communications for the server 600A from system 500B are made via system 500A, which receives and retransmits them to server 600A. Although network 700 contains one server 600A and two systems 500A, 500B, there may be any number of systems and servers in other networks.

What is claimed is:

1. A method comprising:

providing a plurality of sensors, at least one of the plurality of sensors capable of providing at least one indication of at least one other-than-current condition of a protective device as it goes from a first state in which it is able to conduct current substantially at its rated capacity to a second state in which it is not able to conduct current substantially at its rated capacity, that the protective device has gone from the first state to the second state, at least near in time when at least one other of the plurality of sensors does not provide at least one indication of at least one different other-than-current condition of the protective device that the protective device has gone from the first state to the second state because of an influence of a device external to the protective device that is expected to occur;

receiving the at least one indication from at least one of the plurality of sensors that sense changes to a protective device as it goes from a first state in which it is able to conduct current substantially at its rated capacity to a second state in which it is not able to conduct current substantially at its rated capacity;

identifying at least one other-than-current indication as indicating that the protective device has at least reduced carrying current below its rated capacity from the at least one other-than-current indication received;

reporting an indication of the at least one other-than-current indication to a central device; and identifying whether the at least one other-than-current indication is followed by at least one indication that the at least one other-than-current indication is a false positive rather than a true indication of an other-than-current condition of the protective device;

wherein the protective device comprises a cutout or recloser, the cutout or recloser being configured for use in a power distribution system.

2. The method of claim 1, additionally comprising receiving at least one indication of current from at least one of the plurality of sensors; and verifying the at least one indication of current.

3. The method of claim 1, additionally comprising providing a human observable indicator of the at least one other-than-current condition in a vicinity of the protective device.

4. The method of claim 1, wherein at least one of the at least one other-than-current conditions comprises movement of a component of the protective device that occurs when the protective device at least limits current.

5. The method of claim 1, wherein at least one of the at least one other-than-current conditions comprises sound or vibration from a component of the protective device that is generated when the protective device at least limits current.

6. The method of claim 1, wherein at least two of the sensor readings comprise other-than-current indications.

7. The method of claim 1, wherein at least one of the plurality of sensors is capable of providing at least one indication of at least one other-than-current condition, the at least one other-than-current condition being selected from a group comprising noise, vibration, movement of the protective device, orientation of an electric field, and change in orientation of an electric field.

8. The method of claim 1, wherein at least one of the plurality of sensors is capable of providing at least one indication of at least one other-than-current condition, the at least one other-than-current condition being movement of the protective device.

9. A system comprising:

a plurality of sensors, comprising a plurality of other-than-current sensors capable of sensing and providing at an output at least one indication of at least one other-than-current condition of a protective device as it goes from a first state in which it is able to conduct current substantially at its rated capacity to a second state in which it is not able to conduct current substantially at its rated capacity, that the protective device has gone from the first state to the second state, at least near in time when at least one other of the plurality of sensors does not provide at least one indication of at least one different other-than-current condition of the protective device that the protective device has gone from the first state to the second state because of an influence of a device external to the protective device that is expected to occur;

at least one sensor manager having an input coupled to at least one of the plurality of sensors for receiving the at least one indication from at least one of the plurality of sensors that sense changes to a protective device as it goes from a first state in which it is able to conduct current substantially at its rated capacity to a second state in which it is not able to conduct current substantially at its rated capacity, the at least one sensor manager for identifying at least one other-than current indication as indicating that the protective device has at least reduced carrying current below its rated capacity from the sensor readings received, and for signaling at an output in response to such identifying, and for identifying whether the at least one other-than-current indication is followed by at least one indication that the at least one other-than-current indication is a false positive rather than a true indication of an other-than-current condition of the protective device; and a report manager reporting an indication of the at least one other-than-current indication to a central device;

wherein the protective device comprises a cutout or recloser, the cutout or recloser being configured for use in a power distribution system.

10. The system of claim 9, additionally comprising receiving at least one indication of current from at least one of the plurality of sensors; and verifying the at least one indication of current.

11. The system of claim 9, additionally comprising providing a human observable indicator of the other-than-current condition in a vicinity of the protective device.

12. The system of claim 8, wherein at least one of the at least one other-than-current conditions comprises movement of a component of the protective device that occurs when the protective device at least limits current.

13. The system of claim 9, wherein at least one of the at least one other-than-current conditions comprises sound or vibration from a component of the protective device that is generated when the protective device at least limits current.

14. The system of claim 9, wherein at least two of the sensor readings comprise other-than-current indications.

15. The system of claim 9, wherein at least one of the plurality of sensors is capable of providing at least one indication of at least one other-than-current condition, the at least one other-than-current condition being selected from a group comprising noise, vibration, movement of the protective device, orientation of an electric field, and change in orientation of an electric field.

16. The system of claim 9, wherein at least one of the plurality of sensors is capable of providing at least one indication of at least one other-than-current condition, the at least one other-than-current condition being movement of the protective device.

17. A computer program product comprising a computer useable medium having computer readable program code embodied therein, the computer program product comprising computer readable program code devices configured to cause a computer system to:

provide a plurality of sensors, at least one of the plurality of sensors capable of providing at least one indication of at least one other-than-current condition of a protective device as it goes from a first state in which it is able to conduct current substantially at its rated capacity to a second state in which it is not able to conduct current substantially at its rated capacity, that the protective device has gone from the first state to the second state, at least near in time when at least one other of the plurality of sensors does not provide at least one indication of at least one different other-than-current condition of the protective device that the protective device has gone from the first state to the second state because of an influence of a device external to the protective device that is expected to occur;

receive the at least one indication from at least one of the plurality of sensors that sense changes to a protective device as it goes from a first state in which it is able to conduct current substantially at its rated capacity to a second state in which it is not able to conduct current substantially at its rated capacity;

identify at least one other-than-current indication as indicating that the protective device has at least reduced carrying current below its rated capacity from the at least one other-than-current indication received; and report an indication of the at least one other-than-current indication to a central device; and identify whether the at least one other-than-current indication is followed by at least one indication that the at least one other-than-current indication is a false positive rather than a true indication of an other-than-current condition of the protective device;

wherein the protective device comprises a cutout or recloser, the cutout or recloser being configured for use in a power distribution system.

18. The computer program product of claim 17, additionally comprising computer readable program code devices configured to cause the computer system to receive at least one indication of current from at least one of the plurality of sensors and to verify the at least one indication of current.

19. The computer program product of claim 17, additionally comprising computer readable program code devices configured to cause the computer system to provide a human observable indicator of the other-than-current condition in a vicinity of the protective device.

20. The computer program product of claim 17, wherein at least one of the at least one other-than-current conditions comprises movement of a component of the protective device that occurs when the protective device at least limits current.

21. The computer program product of claim 17, wherein at least one of the at least one other-than-current conditions comprises sound or vibration from a component of the protective device that is generated when the protective device at least limits current.

22. The computer program product of claim 17, wherein at least two of the sensor readings comprise other-than-current indications.

23. The computer program product of claim 17, wherein at least one of the plurality of sensors is capable of providing at least one indication of at least one other-than-current condition, the at least one other-than-current condition being selected from a group comprising noise, vibration, movement of the protective device, orientation of an electric field, and change in orientation of an electric field.

24. The computer program product of claim 17, wherein at least one of the plurality of sensors is capable of providing at least one indication of at least one other-than-current condition, the at least one other-than-current condition being movement of the protective device.

* * * * *